(12) United States Patent
Iyer et al.

(10) Patent No.: US 8,227,304 B2
(45) Date of Patent: Jul. 24, 2012

(54) SEMICONDUCTOR-ON-INSULATOR (SOI) STRUCTURE AND METHOD OF FORMING THE SOI STRUCTURE USING A BULK SEMICONDUCTOR STARTING WAFER

(75) Inventors: Subramanian S. Iyer, Mount Kisco, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 12/710,380

(22) Filed: Feb. 23, 2010

(65) Prior Publication Data

US 2011/0204443 A1 Aug. 25, 2011

(51) Int. Cl.
*H01L 21/84* (2006.01)
*H01L 21/20* (2006.01)
*H01L 27/12* (2006.01)

(52) U.S. Cl. ............... 438/164; 438/481; 257/E21.562; 257/347

(58) Field of Classification Search .................. 438/164, 438/481; 257/E21.562, 347
See application file for complete search history.

(56) References Cited

U.S. PATENT DOCUMENTS

| | | | |
|---|---|---|---|
| 4,952,526 A * | 8/1990 | Pribat et al. ................... 438/412 |
| 6,413,802 B1 | 7/2002 | Hu et al. | |
| 6,433,609 B1 | 8/2002 | Voldman | |
| 6,642,090 B1 | 11/2003 | Fried et al. | |
| 6,645,797 B1 | 11/2003 | Buynoski et al. | |
| 6,709,982 B1 | 3/2004 | Buynoski et al. | |
| 6,864,164 B1 | 3/2005 | Dakshina-Murthy et al. | |
| 6,972,228 B2 * | 12/2005 | Doyle et al. ................... 438/256 |
| 7,129,142 B2 * | 10/2006 | Wristers et al. ............... 438/305 |
| 7,244,659 B2 * | 7/2007 | Tang et al. ..................... 438/429 |
| 7,323,375 B2 * | 1/2008 | Yoon et al. ..................... 438/164 |
| 7,407,847 B2 * | 8/2008 | Doyle et al. ................... 438/164 |
| 7,498,265 B2 * | 3/2009 | Wells et al. .................... 438/700 |
| 2006/0197129 A1 | 9/2006 | Wohlmuth | |
| 2007/0102756 A1 | 5/2007 | Lojek | |
| 2007/0176245 A1 | 8/2007 | Kim et al. | |
| 2007/0272954 A1 | 11/2007 | Chen et al. | |
| 2007/0281446 A1 | 12/2007 | Winstead et al. | |

* cited by examiner

*Primary Examiner* — Charles Garber
*Assistant Examiner* — Ron Pompey
(74) *Attorney, Agent, or Firm* — Gibb & Riley, LLC; Richard M. Kotulak, Esq.

(57) ABSTRACT

Disclosed is a method of forming a semiconductor-on-insulator (SOI) structure on a bulk semiconductor starting wafer. Parallel semiconductor bodies are formed at the top surface of the wafer. An insulator layer is deposited and recessed. Exposed upper portions of the semiconductor bodies are used as seed material for growing epitaxial layers of semiconductor material laterally over the insulator layer, thereby creating a semiconductor layer. This semiconductor layer can be used to form one or more SOI devices (e.g., a single-fin or multi-fin MUGFET or multiple series-connected single-fin or multi-fin MUGFETs). However, placement of SOI device components in and/or on portions of the semiconductor layer should be predetermined to avoid locations which might impact device performance (e.g., placement of any FET gate on a semiconductor fin formed from the semiconductor layer can be predetermined to avoid interfaces between joined epitaxial semiconductor material sections). Also disclosed is a SOI structure formed using the above-described method.

24 Claims, 10 Drawing Sheets

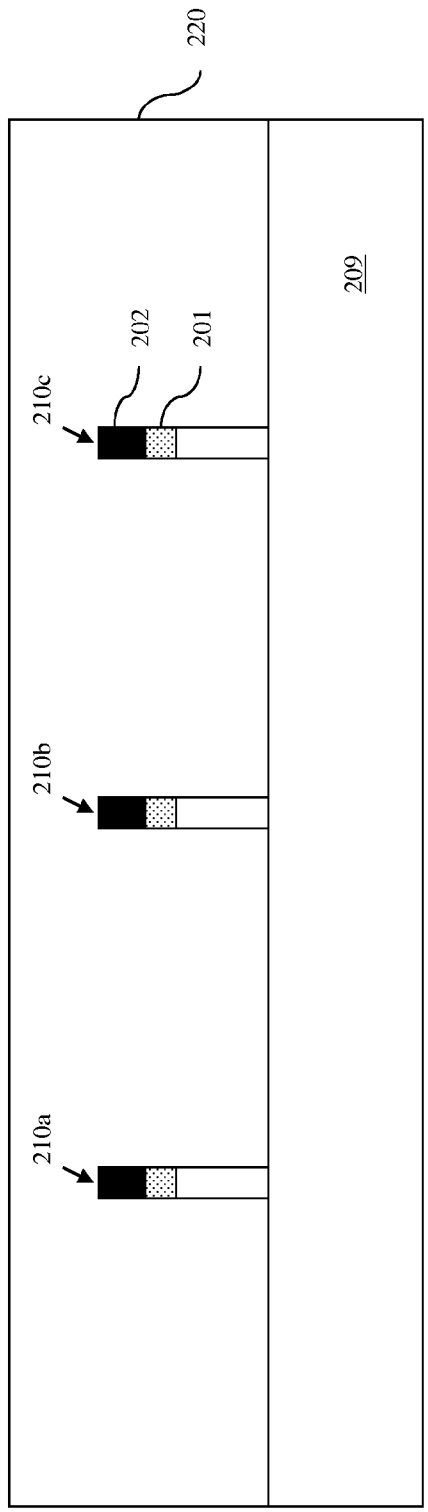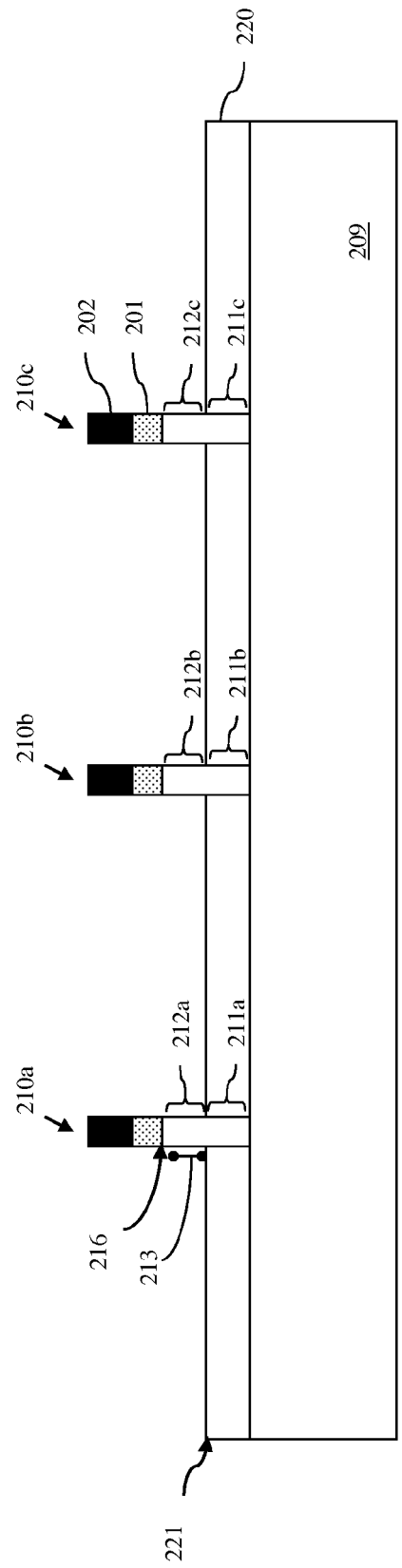

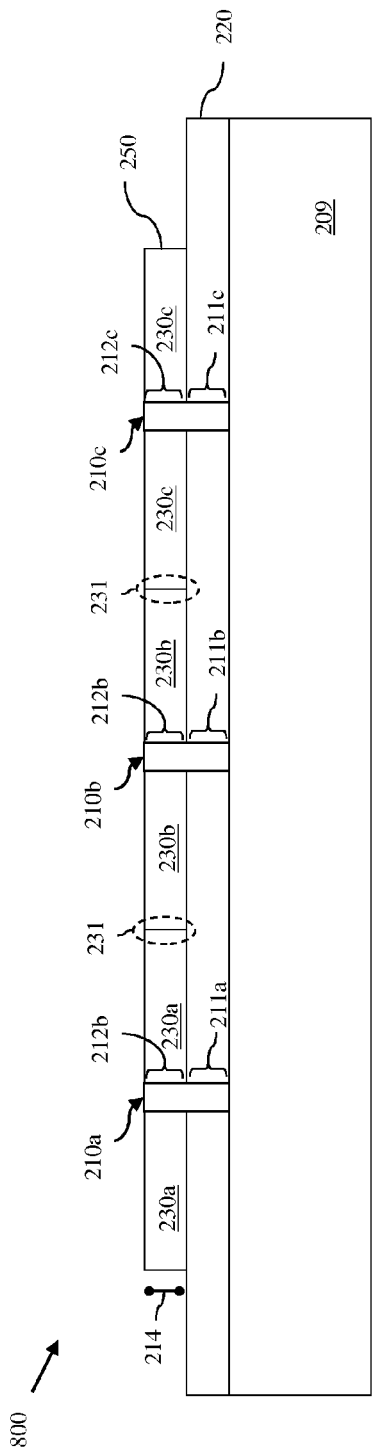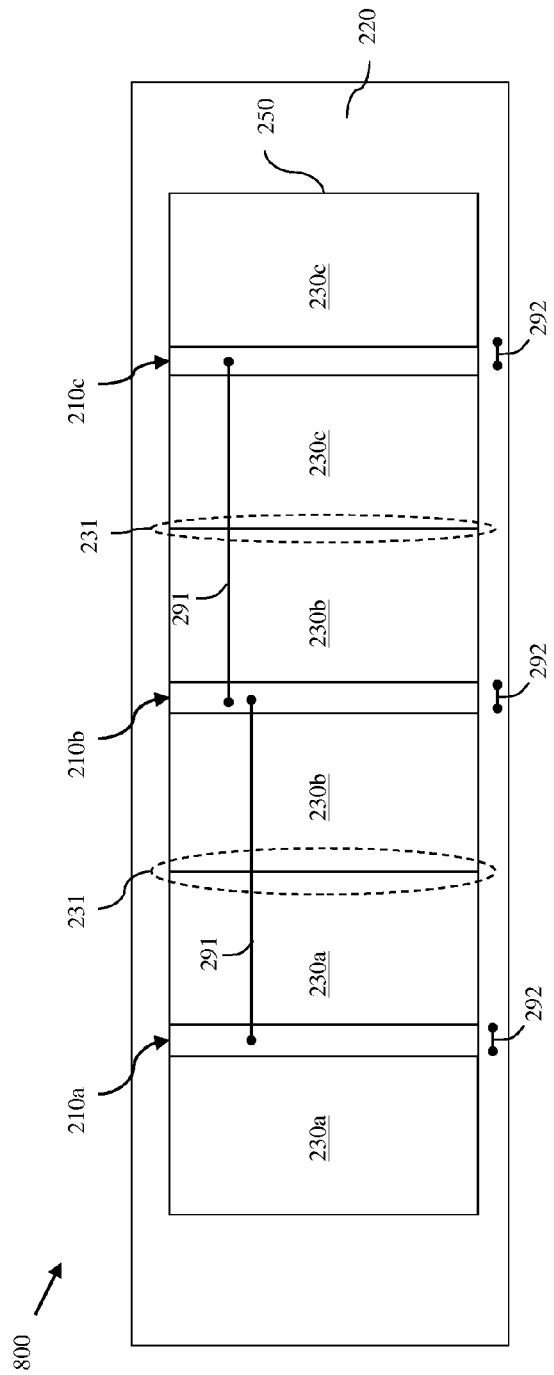
Figure 8A
Figure 8B

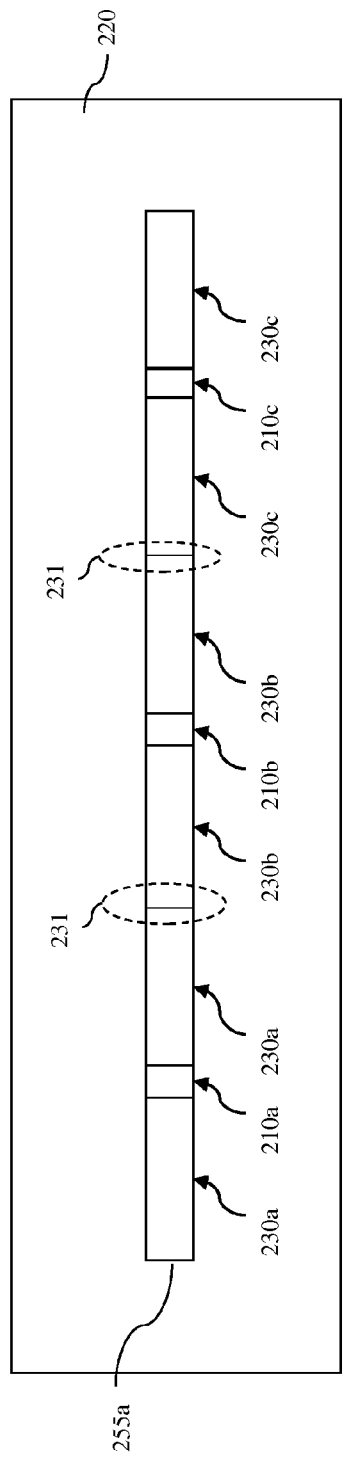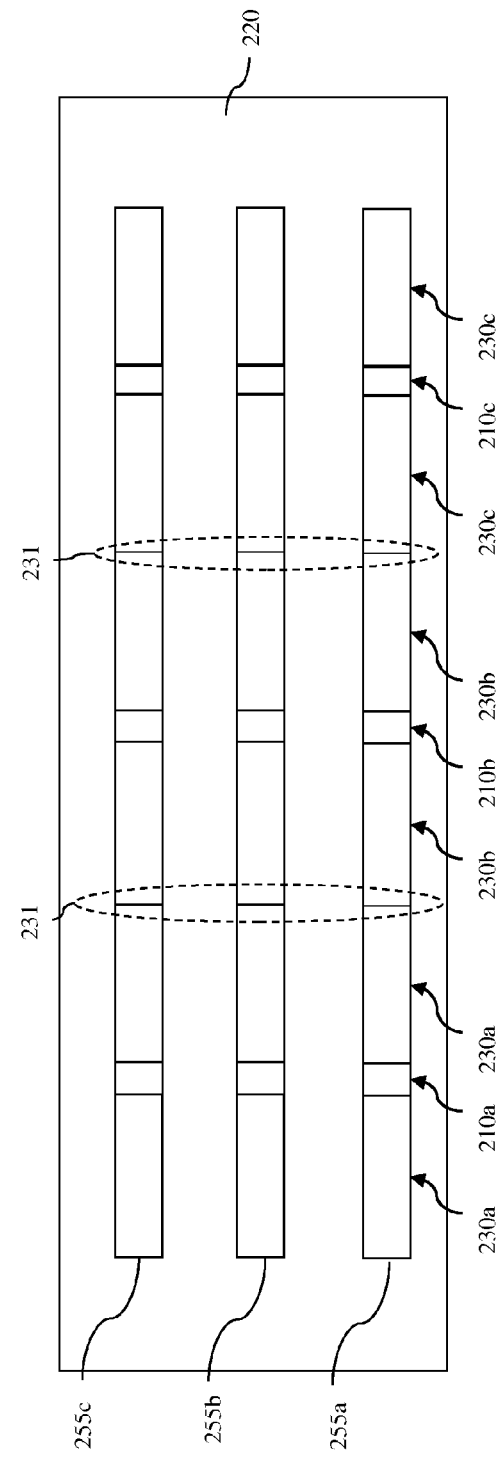

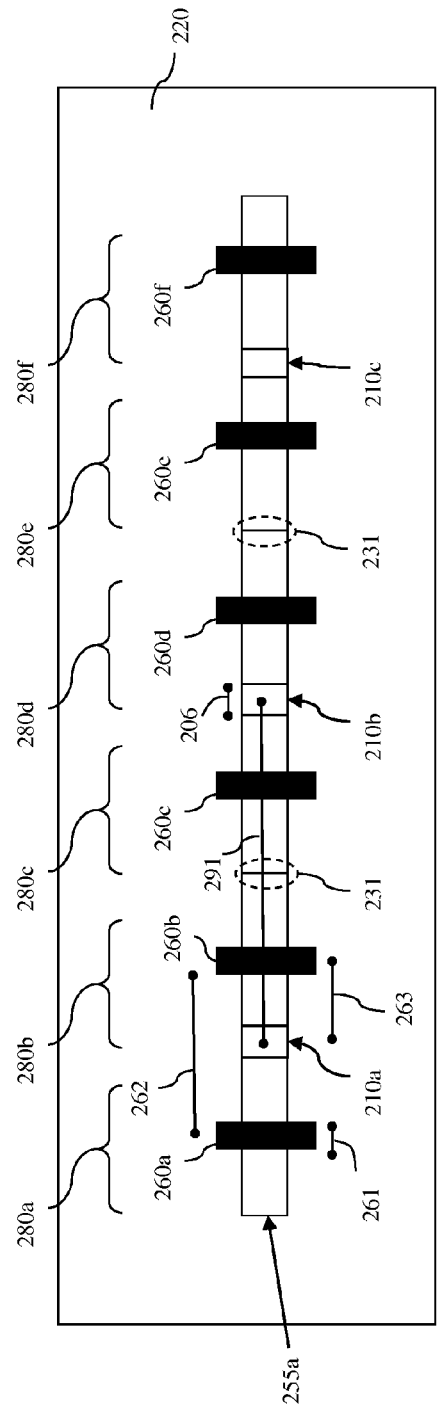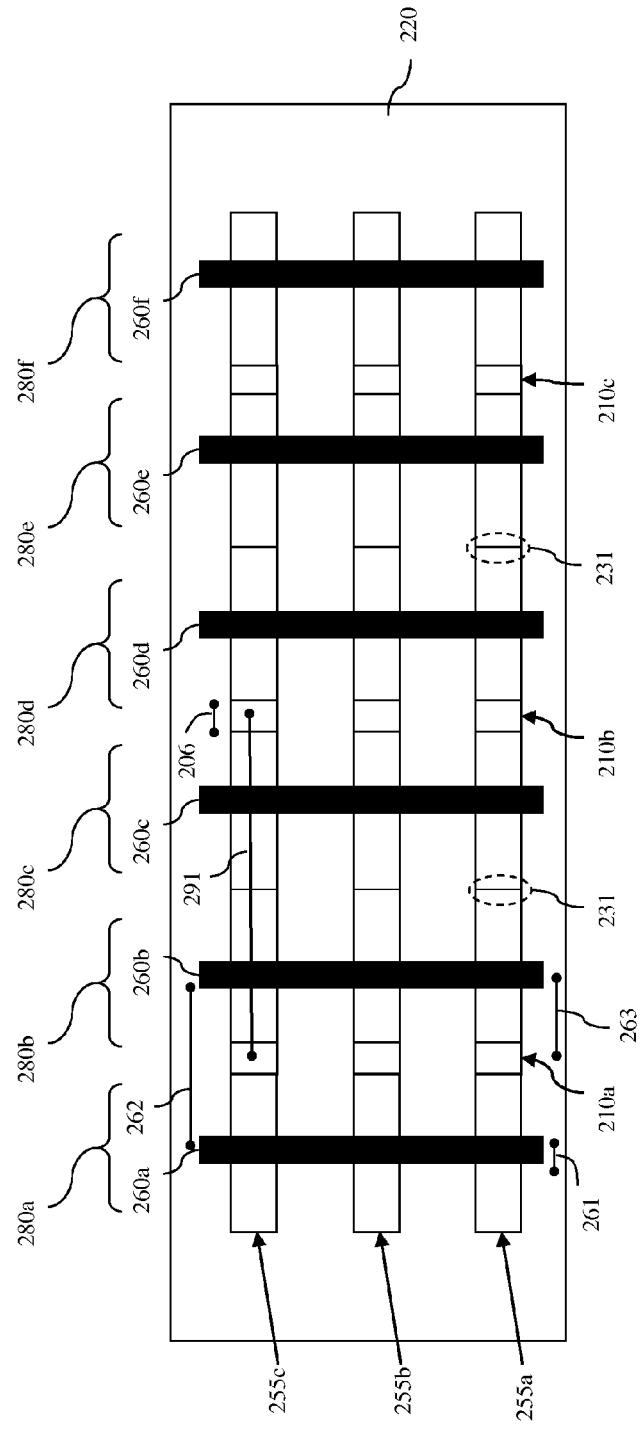

SEMICONDUCTOR-ON-INSULATOR (SOI) STRUCTURE AND METHOD OF FORMING THE SOI STRUCTURE USING A BULK SEMICONDUCTOR STARTING WAFER

BACKGROUND

1. Field of the Invention

The embodiments of the invention generally relate to semiconductor-on-insulator (SOI) structures and, more specifically, to a SOI structure, including one or more SOI devices (e.g., a non-planar field effect transistor (FET) or multiple series-connected non-planar FETs), and a method of forming the structure using a bulk semiconductor starting wafer.

2. Description of the Related Art

Integrated circuit design decisions are driven not only by device scalability, but also by manufacturing efficiency and cost. For example, multi-gate non-planar field effect transistors (MUGFETs), such as dual-gate FETs and tri-gate FETs, were developed to provide scaled devices with increased drive current and reduced short channel effects. However, even though bulk semiconductor starting wafers are generally less expensive than semiconductor-on-insulator (SOI) starting wafers, MUGFETs are typically designed and manufactured using SOI starting wafers. This is because MUGFET formation on bulk semiconductor wafers currently requires additional, costly and complex processing in order to provide adequate isolation (e.g., between the MUGFETs and the bulk semiconductor substrate). Thus, it is currently more cost-effective to manufacture MUGFETs on the more expensive SOI starting wafers.

SUMMARY

Generally, disclosed herein are embodiments of a method of forming a semiconductor-on-insulator (SOI) structure, including one or more SOI devices. The method embodiments can comprise providing a bulk semiconductor substrate. Multiple parallel rectangular-shaped semiconductor bodies (i.e., semiconductor islands) can be etched into the top surface of the substrate. Next, a blanket insulator layer can be deposited over the semiconductor bodies. This blanket insulator layer can then be planarized and recessed to expose upper portions of the semiconductor bodies. Once the upper portions of the semiconductor bodies are exposed, epitaxial layers of semiconductor material can be grown laterally from the opposing sidewalls of the upper portions of the semiconductor bodies (e.g., until any epitaxial layers grown in opposite directions from adjacent semiconductor fins join, thereby covering the insulator layer). This lateral epitaxial growth process effectively creates a single semiconductor layer above the level of the top surface of the insulator layer. Additional processing can then be performed on the semiconductor layer in order to form one or more SOI devices, including but not limited to SOI planar FET(s), SOI MUGFET(s) (e.g., a single-fin or multi-fin MUGFETs, multiple series-connected single-fin or multi-fin MUGFETs, etc.) or any other SOI device typically formed on a SOI starting wafer. However, placement of SOI device components in and/or on portions of the semiconductor layer should be predetermined in order to avoid locations which might impact device performance. For example, placement of any MUGFET gate on a semiconductor fin formed from the semiconductor layer can be predetermined to avoid alignment over interfaces between joined epitaxial semiconductor material sections and/or over bulk semiconductor material sections.

More particularly, in each of the method embodiments disclosed herein a semiconductor structure can be formed by first etching multiple parallel rectangular-shaped semiconductor bodies in the top surface of a bulk semiconductor substrate. Then, a blanket insulator layer can be formed over the semiconductor bodies. After the blanket insulator layer is formed, it can be recessed (i.e., etched back) to expose only the upper portions of the semiconductor bodies. Then, epitaxial layers of semiconductor material can be grown laterally from the opposing sidewalls of the exposed upper portions of the semiconductor bodies. This epitaxial growth process can be performed until any epitaxial layers grown in opposite directions from adjacent semiconductor bodies join, thereby creating a single semiconductor layer. Then, additional processing can then be performed on the semiconductor layer in order to form one or more SOI devices (e.g., a single-fin or multi-fin MUGFET, multiple series-connected single-fin or multi-fin MUGFETs, etc.).

For example, a single semiconductor fin or multiple parallel semiconductor fins can be formed from the semiconductor layer such that each semiconductor fin is above the level of the top surface of the insulator layer and perpendicular to the semiconductor bodies. Thus, each semiconductor fin will comprise epitaxial semiconductor material sections on the insulator layer and also bulk semiconductor material sections. Each of the bulk semiconductor material sections within a fin will be positioned laterally between two discrete epitaxial semiconductor material sections and will extend vertically through the insulator layer to the substrate. Furthermore, any pair of adjacent bulk semiconductor material sections within a fin will be separated by two joined epitaxial semiconductor material sections.

Next, a gate, for a single-fin MUGFET or a multi-fin MUGFET, can be formed perpendicular to and traversing one semiconductor fin or multiple semiconductor fins, respectively, at a location that is offset from any interface between any joined epitaxial semiconductor material sections. Alternatively, multiple gates, for multiple series-connected single-fin MUGFETs or multiple series-connected multi-fin MUGFETs, can be formed perpendicular to and traversing one semiconductor fin or multiple semiconductor fins, respectively, at different locations such the gates are all offset from any interfaces between any joined epitaxial semiconductor material sections. For example, if the semiconductor bodies are formed such that each pair of adjacent semiconductor bodies has a same first pitch and if the multiple gates are formed such that each pair of adjacent gates has a same second pitch that is equal to one-half the first pitch and such that a distance between any given gate and a closest semiconductor body is equal to one-quarter the first pitch, then in the resulting semiconductor structure the gates will all be offset from any interfaces between any joined epitaxial semiconductor material sections.

It should be noted that, at some point during the above-described method embodiments, a dopant implantation process can be performed in order to ensure that lower portions of the semiconductor bodies are appropriately doped in order to electrically isolate the upper portions of the semiconductor bodies and, thereby the semiconductor layer and any semiconductor fins formed thereon, from any substrate material below the insulator layer.

Also disclosed herein are embodiments of a semiconductor-on-insulator (SOI) structure, including one or more SOI devices (e.g., a single-fin or multi-fin MUGFET, multiple series-connected single-fin or multi-fin MUGFETs, etc.) formed according to the method embodiments described above. Specifically, the SOI structure can comprise a bulk semiconductor substrate and an insulator layer on the substrate. Additionally, the SOI structure can comprise a single semiconductor fin or multiple parallel semiconductor fins above the insulator layer. Each semiconductor fin can comprise epitaxial semiconductor material sections on the insulator layer and also bulk semiconductor material section. Each of the bulk semiconductor material sections within a fin can be positioned laterally between two discrete epitaxial semiconductor material sections and can extend vertically through the insulator layer to the substrate. Furthermore, any pair of adjacent bulk semiconductor material sections within a fin can be separated by two joined epitaxial semiconductor material sections.

For a single-fin MUGFET or a multi-fin MUGFET, a gate can be positioned perpendicular to and can traverse the semiconductor fin or fins, respectively, at a location that is offset from an interface between any joined epitaxial semiconductor material sections. For multiple series-connected single-fin MUGFETs or multiple series-connected multi-fin MUGFETs, multiple gates can be positioned perpendicular to and can traverse the semiconductor fin or fins, respectively, at different locations such that the gates are all offset from any interfaces between any joined epitaxial semiconductor material sections. For example, each pair of adjacent bulk semiconductor sections can have a same first pitch, each pair of adjacent gates can have a same second pitch that is equal to one-half the first pitch, and a distance between any given gate and a closest bulk semiconductor section can be equal to one-quarter the first pitch such that the gates are all offset from any interfaces between any joined epitaxial semiconductor material sections.

It should be noted that, in any of the above-described structure embodiments, dopants in the lower portions of the lower portions of the bulk semiconductor material sections can electrically isolate upper portions of the bulk semiconductor material sections from the bulk semiconductor substrate below the insulator layer.

BRIEF DESCRIPTION OF THE SEVERAL VIEWS OF THE DRAWINGS

The embodiments of the invention will be better understood from the following detailed description with reference to the drawings, which are not necessarily drawing to scale and in which:

FIG. 5 is cross-section diagram illustrating a partially completed structure formed according to the method of FIG. 1;

FIG. 6 is cross-section diagram illustrating a partially completed structure formed according to the method of FIG. 1;

FIG. 8A is cross-section diagram illustrating a SOI structure formed according to the method of FIG. 1;

FIG. 8B is a top view diagram illustrating a SOI structure formed according to the method of FIG. 1;

FIG. 9A is top view diagram illustrating a single semiconductor fin formed using the SOI structure of FIG. 8B;

FIG. 9B is a top view diagram illustrating multiple semiconductor fins formed using the SOI structure of FIG. 8B;

FIG. 11A is top view diagram illustrating multiple series-connected single-fin multi-gate field effect transistors (i.e., multiple series-connected single-fin MUGFETs) formed using the single semiconductor fin of FIG. 9A;

FIG. 11B is top view diagram illustrating multiple series-connected multi-fin multi-gate field effect transistors (i.e., multiple series-connected multi-fin MUGFETs) formed using the multiple semiconductor fins of FIG. 9B.

DETAILED DESCRIPTION

Figure 1:
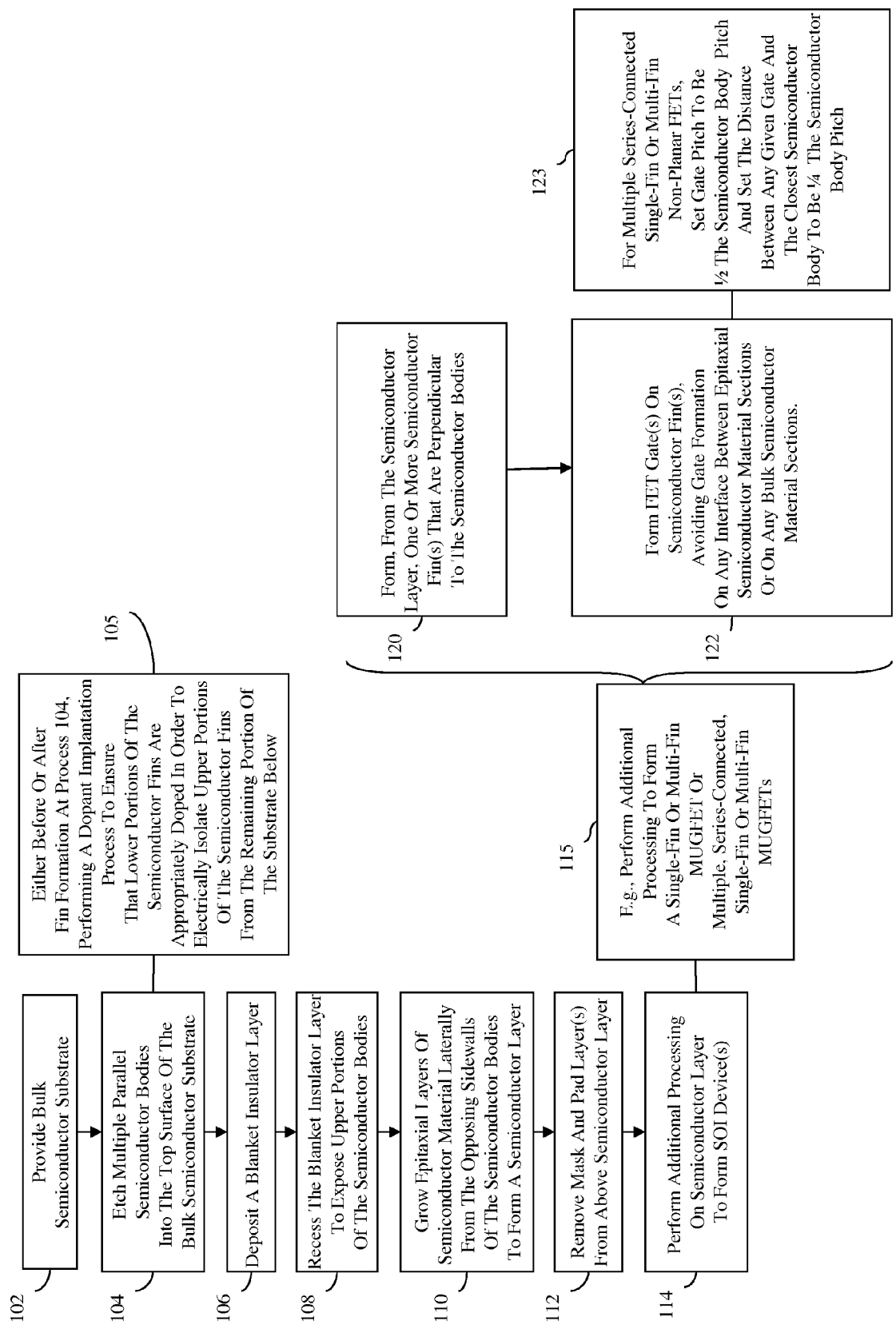
FIG. 1 is a flow diagram illustrating embodiments of a method of forming a semiconductor-on-insulator (SOI) structure, including SOI devices, from a bulk semiconductor starting wafer.

The embodiments of the invention and the various features and advantageous details thereof are explained more fully with reference to the non-limiting embodiments that are illustrated in the accompanying drawings and detailed in the following description.

As mentioned above, integrated circuit design decisions are driven not only by device scalability, but also by manufacturing efficiency and cost. For example, multi-gate non-planar field effect transistors (MUGFETs) were developed to provide scaled devices with increased drive current and reduced short channel effects. Dual-gate FETs (also referred to as fin-type FETs or FINFETs) are multi-gate non-planar FETs formed using relatively thin semiconductor fins. Specifically, source and drain regions are formed within the opposing ends of a thin semiconductor fin and a fully depleted channel region is formed within the center of the semiconductor fin positioned laterally between the source and drain regions. A gate is formed over the top surface and on each side of the thin fin in an area corresponding to the channel region to provide two-dimensional field effects. A dielectric cap layer, such as a nitride cap layer, typically isolates the top surface of the channel region from the gate so that only two-dimensional field effects are exhibited. The effective channel width is determined by the fin height. Additionally, a fin thickness that is approximately one-half (or less) the length of the gate can ensure suppression of deleterious short-channel effects, such as variability in threshold voltage and excessive drain leakage currents. Tri-gate FETs are similar in structure to FINFETs except that the semiconductor fin of a tri-gate FET is wider and devoid of a dielectric cap layer. Thus, a gate formed over the top surface and on each side of the semiconductor fin in an area corresponding to the channel region causes three-dimensional field effects, vice two-dimensional field effects, to be exhibited. Typically, the fin height to width ratio in a tri-gate FET is in the range of 3:2 to 2:3 so that the channel region will remain fully depleted and so that the resulting three-dimensional field effects will provide greater device drive current and improved short-channel characteristics over a planar transistor. The effective channel width of MUGFETs and, thereby, the device drive current can be increased by using multiple semiconductor fins.

However, even though bulk semiconductor starting wafers are generally less expensive than semiconductor-on-insulator (SOI) starting wafers, MUGFETs are typically designed and manufactured using SOI starting wafers. This is because MUGFET formation on bulk semiconductor wafers currently requires additional, costly and complex processing in order to provide adequate isolation (e.g., between the MUGFETs and the substrate). Thus, it is currently more cost-effective to manufacture MUGFETs using the more expensive SOI starting wafers.

In view of the foregoing disclosed herein are embodiments of a method of forming a semiconductor-on-insulator (SOI) structure, including one or more SOI devices, on a bulk semiconductor starting wafer and doing so without requiring additional complex and costly processing steps to ensure adequate isolation for the SOI devices. In the method embodiments, multiple parallel essentially rectangular-shaped semiconductor bodies are formed at the top surface of the wafer. A blanket insulator layer is deposited and recessed to expose upper portions of the semiconductor bodies. Then, the upper portions of the semiconductor bodies are used as seed material for growing epitaxial layers of semiconductor material laterally over the insulator layer, thereby creating a semiconductor layer on the insulator layer. Additional processing can then be performed on the semiconductor layer in order to form one or more SOI devices, including but not limited to, SOI planar FET(s), SOI MUGFET(s) (e.g., a single-fin or multi-fin MUGFET, multiple series-connected single-fin or multi-fin MUGFETs, etc.) or any other SOI device typically formed on a SOI starting wafer. However, placement of SOI device components in and/or on portions of the semiconductor layer should be predetermined to avoid locations which might impact device performance. For example, placement of any MUGFET gate on a semiconductor fin formed from the semiconductor layer can be predetermined to avoid alignment over interfaces between joined epitaxial semiconductor material sections and/or over bulk semiconductor material sections. Also disclosed are embodiments of a SOI structure formed using the above-described method.

Figure 2:
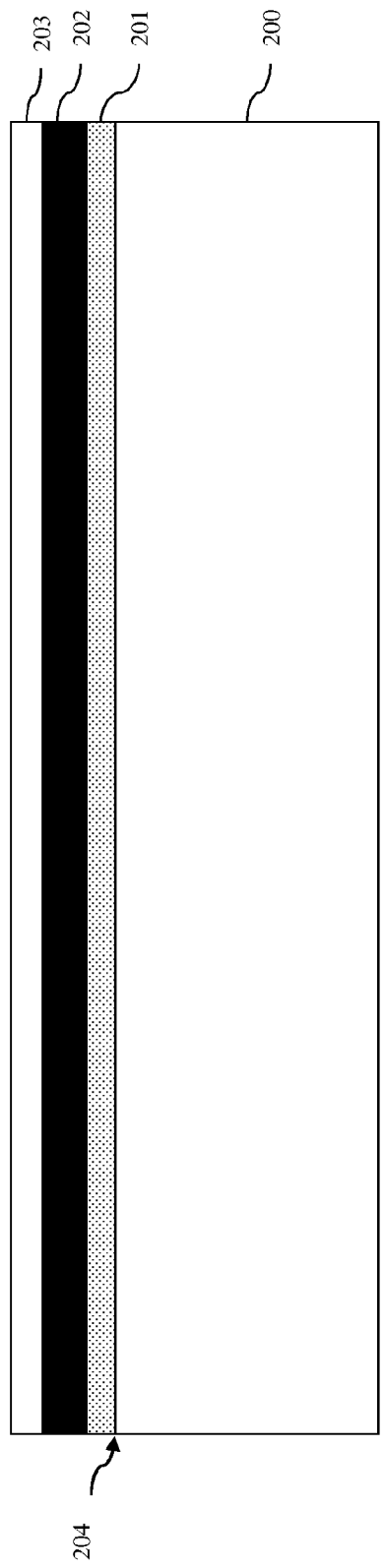
FIG. 2 is cross-section diagram illustrating a partially completed structure formed according to the method of FIG. 1.
Figure 3:
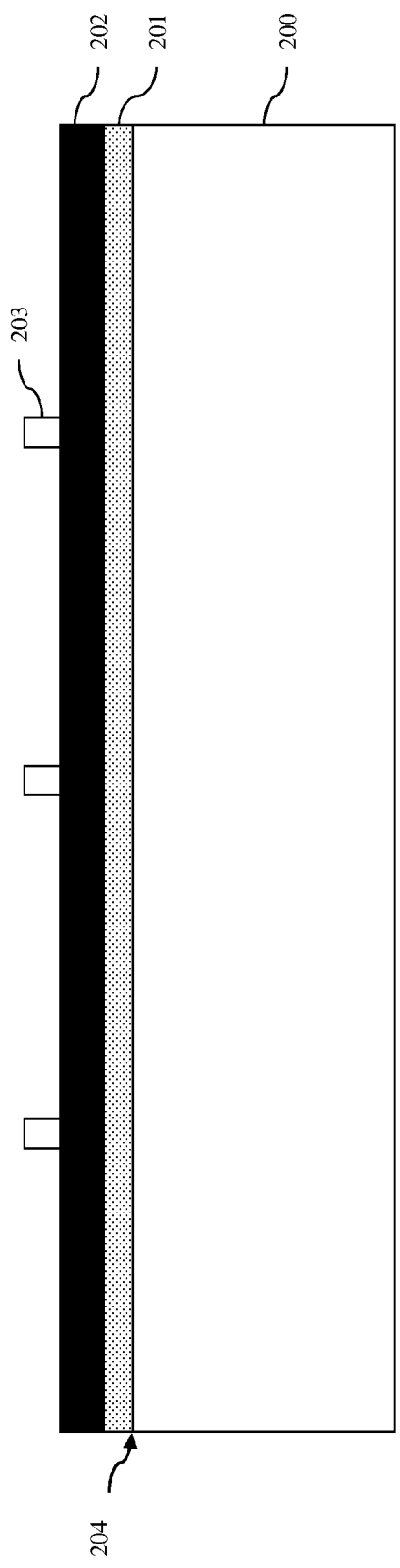
FIG. 3 is cross-section diagram illustrating a partially completed structure formed according to the method of FIG. 1.
Figure 4:
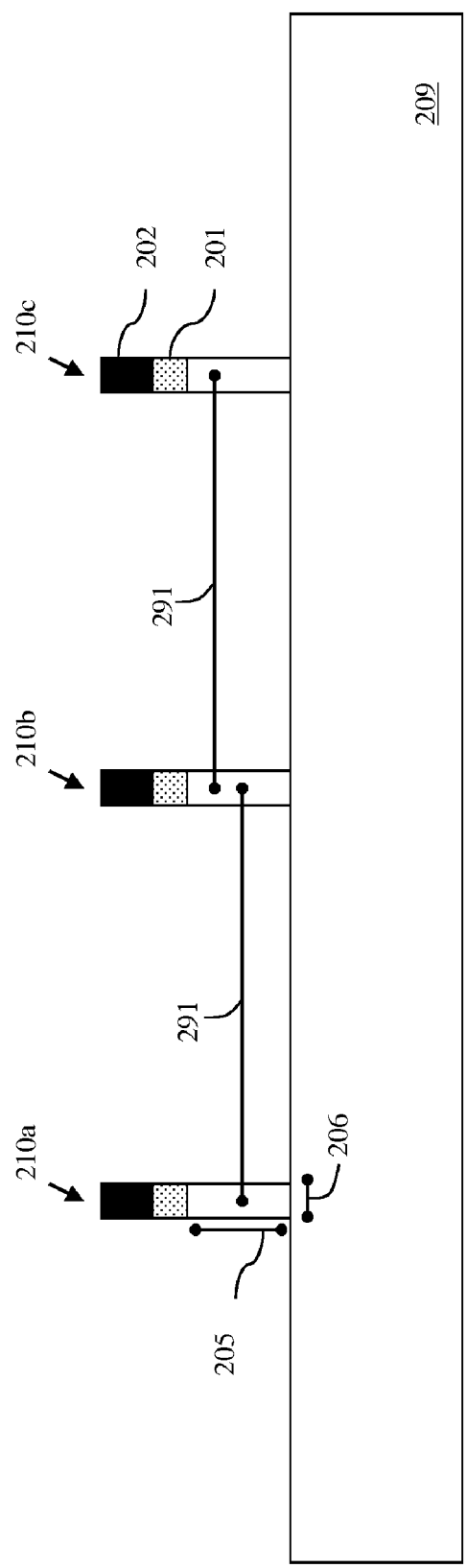
FIG. 4 is cross-section diagram illustrating a partially completed structure formed according to the method of FIG. 1.

Referring to the flow diagram of FIG. 1, disclosed herein are embodiments of a method of forming a semiconductor-on-insulator (SOI) structure, including one or more SOI devices. The method embodiments can comprise providing a bulk semiconductor substrate 200 (e.g., a bulk semiconductor starting wafer or, more particularly, a bulk silicon starting wafer) (102, see FIG. 2). Multiple parallel essentially rectangular-shaped semiconductor bodies 210a-c (i.e., multiple, parallel, essentially rectangular-shaped, semiconductor islands) can be etched into the top surface 204 of the bulk semiconductor substrate 200 such they project vertically from a remaining bottom portion 209 of the substrate. Optionally, the semiconductor bodies 210a-c can be etched such they all have a same width 206 and same height 205 and further such that each pair of adjacent semiconductor bodies (e.g., 210a-b and 210b-c) have a same pitch 291 (104, see FIGS. 2-4).

To form these semiconductor bodies 210a-c, one or more pad layers 201 (e.g., a pad oxide layer and/or a pad nitride layer) can optionally be formed on the top surface 204 of the substrate 200. Then, a hard mask layer 202 (e.g., a silicon nitride layer) can be formed on the pad layer(s) 201 and a photoresist layer 203 can be formed on the hard mask layer 202 (see FIG. 2). Next, conventional photolithographic processing techniques can be used to print, directly into the photoresist layer 203, a pattern of multiple parallel, essentially rectangular-shaped, features having a same width and same feature-to-feature pitch (see FIG. 3). Then, conventional anisotropic etch processes (e.g., reactive ion etch (RIE) processes) can be used to subsequently transfer the pattern from the photoresist layer 203 into the layers 200-202 below, stopping at a predetermined depth below the top surface of the substrate 200 and, thereby creating the multiple parallel, essentially rectangular-shaped, semiconductor bodies 210a-c (see FIG. 4).

Next, a blanket insulator layer 220 can be deposited over the semiconductor bodies 210a-c (106, see FIG. 5). For example, a silicon dioxide layer 220 can be deposited over the semiconductor bodies 210a-c by conventional oxide deposition processes, such as by chemical vapor deposition (CVD), low-pressure CVD (LPCVD), plasma-enhanced CVD (PECVD), etc. The blanket insulator layer 220 can then be planarized (e.g., by conventional chemical mechanical planarization (CMP)), stopping upon exposure of the hardmask layer 202. Following planarization, the blanket insulator layer 220 can be recessed or etched back (e.g., using a conventional anisotropic reactive ion etch (RIE) process) in order to expose only upper portions 212a-c and not lower portions 211a-c of the semiconductor bodies 210a-c, respectively (108, see FIG. 6). Specifically, this recess process 108 can be performed until a predetermined amount of each the semiconductor bodies 210a-c is exposed (i.e., until the top surface 221 of the insulator layer 220 is etched back a predetermined distance 213 below the top surface 216 of the semiconductor bodies 210a-c), leaving the lower portions 211a-c of the semiconductor bodies 210a-c covered by the insulator layer 220.

Figure 7:
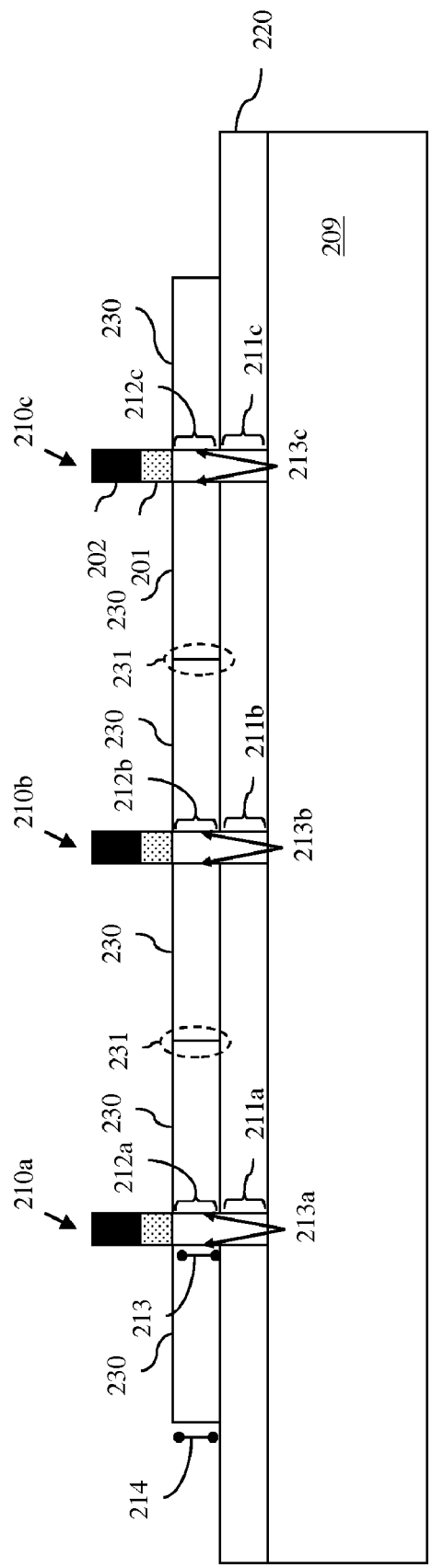
FIG. 7 is cross-section diagram illustrating a partially completed structure formed according to the method of FIG. 1.

Once the upper portions 212a-c of the semiconductor bodies 210a-c are exposed at process 108, epitaxial layers 230a-c of semiconductor material (e.g., of single crystalline silicon) can be grown laterally from the opposing sidewalls 213a-c of the upper portions 212a-c of the semiconductor bodies 210a-c, respectively (e.g., using conventional epitaxial deposition techniques) (110, see FIG. 7). Specifically, the opposing sidewalls 213a-c of the upper portions 212a-c of the semiconductor bodies 210a-c, respectively, can act as seed material, allowing for lateral growth of epitaxial semiconductor material layers 230a-c from the corresponding semiconductor bodies 210a-c. This epitaxial growth process 110 can be performed until any epitaxial layers grown laterally in opposite directions from adjacent semiconductor bodies (e.g., layers 230a and 230b from semiconductor bodies 210a and 210b and layers 230b and 230c from semiconductor bodies 210b and 210c) join at interfaces 231 (i.e., meet, come in contact, connect, etc.), thereby covering the insulator layer 220.

Thus, this epitaxial growth process 110 can create a single semiconductor layer 250 comprising both epitaxial semiconductor material sections (i.e., the epitaxial layers 230a-c of semiconductor material) and also bulk semiconductor material sections (i.e., the semiconductor bodies 210a-c). The epitaxial semiconductor material sections 230a-c are on the insulator layer 220, whereas each bulk semiconductor material section is positioned laterally between two discrete epitaxial semiconductor material sections (e.g., bulk semiconductor material section 210a is positioned laterally between epitaxial semiconductor material sections 230a, bulk semiconductor material section 210b is positioned laterally between epitaxial semiconductor material sections 230b, and so on) and extends vertically through the insulator layer 220 to the remaining substrate 209 below. Furthermore, any pair of adjacent bulk semiconductor material sections is separated by joined epitaxial semiconductor material sections (e.g., adjacent bulk semiconductor material sections 210a and 210b are separated by joined epitaxial semiconductor material sections 230a and 230b and adjacent bulk semiconductor material sections 210b and 210c are separated by joined epitaxial semiconductor material sections 230b and 230c).

It should be noted that, during the epitaxial growth process 110, the mask layer 202 and optional pad layer(s) 201 on the top surface 216 of each semiconductor body 210a-c effectively prevent the epitaxial semiconductor material from growing vertically. Furthermore, since the epitaxial layers 230a-c of semiconductor material only grow laterally at process 110, then the thickness or height 214 of the resulting semiconductor layer 250 will necessarily be approximately equal to the height of the exposed upper portions 212a-c of the semiconductors bodies 210a-c. Thus, at process 108, the predetermined distance 213 to which the insulator layer 220 is etched below the top surface 216 of the semiconductor bodies 210a-c should be equal to the desired height 214 for the semiconductor layer 250.

Once the semiconductor layer 250 is formed, the mask layer 202 and any pad layer(s) 201 can be removed (e.g., by conventional chemical mechanical planarization (CMP) (112, see FIGS. 8A-8B), thereby effectively creating a semiconductor-on-insulator (SOI) structure 800 on which one or more SOI devices can be formed. Specifically, additional processing can be performed on the semiconductor layer 250 in order to form one or more SOI devices, including but not limited to, SOI planar FET(s), SOI non-planar FET(s) (e.g., a single-fin or multi-fin MUGFET, multiple series-connected single-fin or multi-fin non-planar FETs, etc.) or any other SOI device typically formed on a SOI starting wafer (114). However, placement of SOI device components in and/or on portions of the semiconductor layer 250 of the SOI structure 800 should be predetermined to avoid locations which might impact device performance. For example, placement of any FET gate on a semiconductor fin formed from the semiconductor layer 250 can be predetermined to avoid alignment over interfaces 231 between joined epitaxial semiconductor material sections 230a-b and 230b-c and to further avoid alignment over bulk semiconductor material sections 210a-c.

For example, the semiconductor layer 250 can be further processed in order to form a single-fin or multi-fin MUGFET or multiple series-connected single-fin or multi-fin MUGFETs (115). Specifically, a single semiconductor fin (e.g., 255a, see FIG. 9A) or multiple essentially identical parallel semiconductor fins (e.g., 255a-c, see FIG. 9B) can be formed from the semiconductor layer 250 (120). The semiconductor fin(s) 255a-c can be formed, for example, using essentially the same lithographic patterning and etch processes described above for forming the semiconductor bodies 210a-c at process 104. Those skilled in the art will recognize that the height to width ratio of the semiconductor fin(s) 255a-c will vary depending upon whether the MUGFETs 280a-f are to be FINFETs or tri-gate FETs, as discussed above. Those skilled in the art will further recognize that the presence or absence of a dielectric cap layer on the semiconductor fin(s) 255a-c will also vary depending upon whether the MUGFETs 280a-f are to be FINFETs or tri-gate FETs, as discussed above.

The semiconductor fin(s) 255a-c can specifically be formed perpendicular to the previously formed semiconductor bodies 210a-c such that, like the semiconductor layer 250 of FIGS. 8A-B, each semiconductor fin 255a-c comprises: epitaxial semiconductor material sections (i.e., etched portions of the epitaxial layers 230 a-c of semiconductor material) and also bulk semiconductor material sections (i.e., etched portions of the semiconductor bodies 210a-c). The epitaxial semiconductor material sections 230a-c are on the insulator layer 220, whereas each bulk semiconductor material section is positioned laterally between two discrete epitaxial semiconductor material sections (e.g., within each fin 255a-c, bulk semiconductor material section 210a is positioned laterally between epitaxial semiconductor material sections 230a, bulk semiconductor material section 210b is positioned laterally between epitaxial semiconductor material sections 230b, and so on) and extends vertically through the insulator layer 220 to the remaining substrate 209 below. Furthermore, any pair of adjacent bulk semiconductor material sections within a fin is separated by joined epitaxial semiconductor material sections (e.g., adjacent bulk semiconductor material sections 210a and 210b are separated by joined epitaxial semiconductor material sections 230a and 230b and adjacent bulk semiconductor material sections 210b and 210c are separated by joined epitaxial semiconductor material sections 230b and 230c).

Figure 10A:
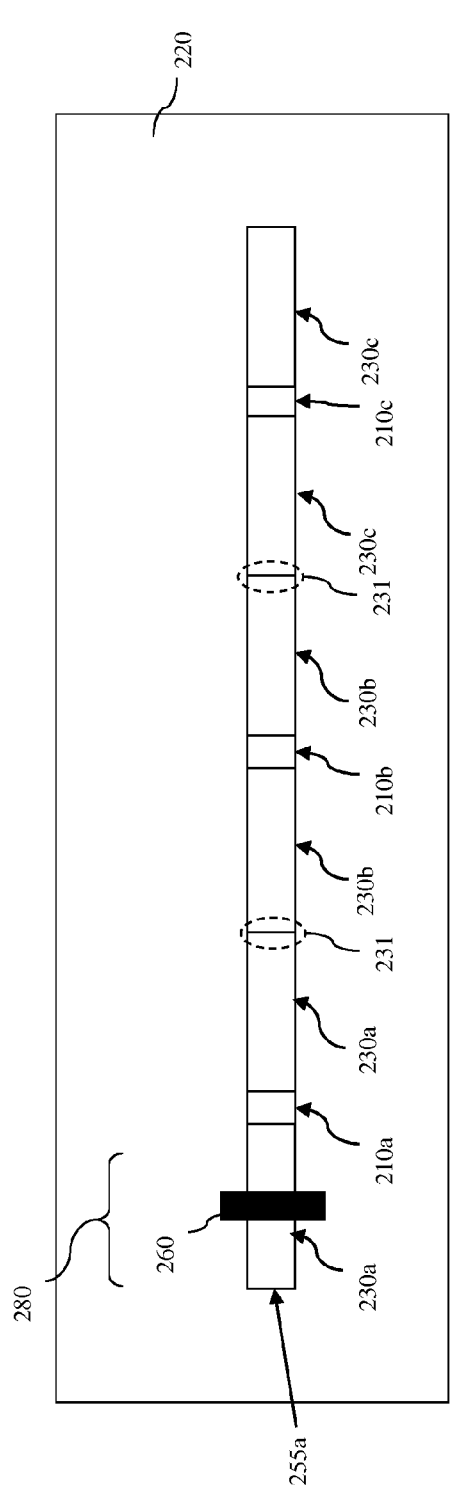
FIG. 10A is top view diagram illustrating a single-fin field effect transistors (i.e., single-fin MUGFET) formed using the single semiconductor fin of FIG. 9A.
Figure 10B:
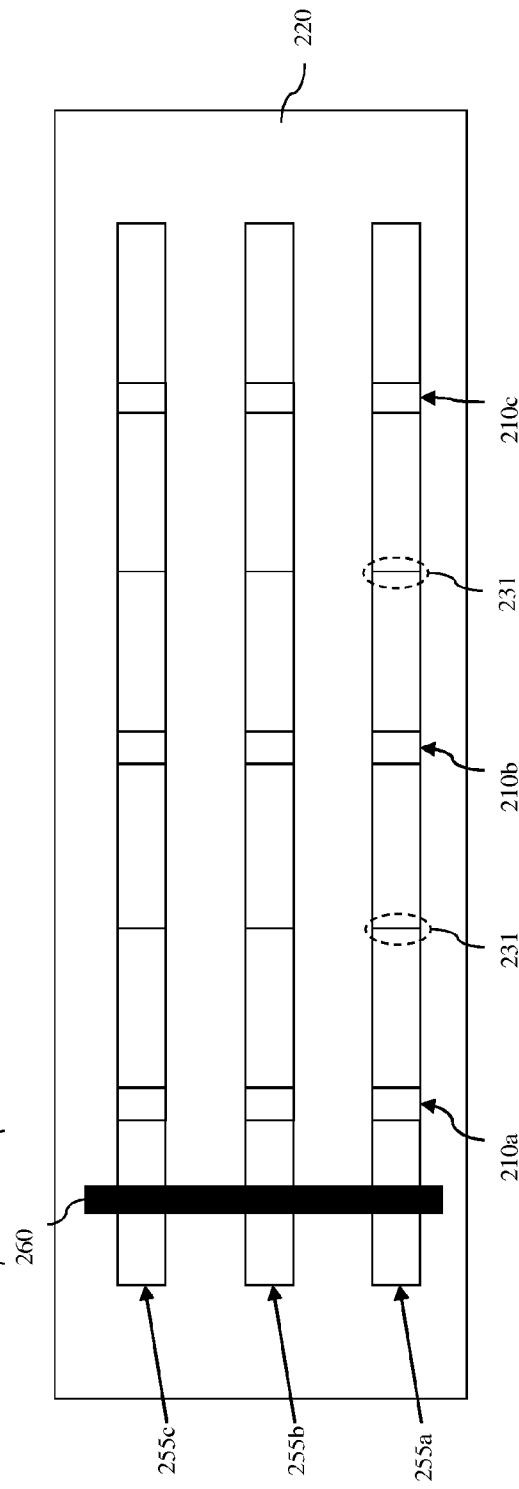
FIG. 10B is top view diagram illustrating a multi-fin field effect transistors (i.e., a multi-fin MUGFET) formed using the multiple semiconductor fins of FIG. 9B.

Following semiconductor fin formation at process 120, a gate 260 can be formed perpendicular to and traversing a single semiconductor fin 255a for a single-fin MUGFET 280 (as shown in FIG. 10A) or perpendicular to and traversing multiple semiconductor fins 255a-c for a multi-fin MUGFET 280 with increased drive current (as shown in FIG. 10B) (122). The location of the designated channel region and, thereby the gate 260 for the single-fin or multi-fin MUGFET 280 should be predetermined such that it is offset from (i.e., not aligned with) any interface 231 between any joined epitaxial semiconductor material sections (e.g., 230a-230b, 230b-230c, etc.) and also offset from any bulk semiconductor material sections 210a-c. In other words, the gate 260 can be formed such that it is not positioned above (i.e., on, immediately adjacent to, etc.) an interface 231 between any joined epitaxial semiconductor material sections 230a-b, 230b-c or above any bulk semiconductor material sections 210a-c.

Alternatively, following semiconductor fin formation at process 120, multiple gates 260a-f can be formed perpendicular to and traversing a single semiconductor fin 255a for multiple series-connected single-fin MUGFETs 280a-f (as shown in FIG. 11A) or perpendicular to and traversing multiple parallel semiconductor fins 255a-c for multiple series-connected multi-fin MUGFETs 280a-f with increased drive current (as shown in FIG. 11B) (122). The different locations of the designated channel regions and, thereby the gates 260a-f for the series-connected single-fin or multi-fin FETs 280a-f should be predetermined such that they are offset from (i.e., not aligned with) any interface 231 between any joined epitaxial semiconductor material sections (e.g., 230a-230b, 230b-230c, etc.) and also offset from any bulk semiconductor material sections 210a-c. In other words, the gates 260a-f can be formed such that they are not positioned above (i.e., on, immediately adjacent to, etc.) any of the interfaces 231 between any joined epitaxial semiconductor material sections 230a-b, 230b-c or above any bulk semiconductor material sections 210a-c.

To form such gate(s), a thin conformal gate dielectric layer (e.g., a gate oxide layer, a high-k gate dielectric layer or any other suitable gate dielectric layer) can be formed such that it covers the top surface and opposing sidewalls of the semiconductor fin(s). Then, a blanket gate conductor layer (e.g., a doped polysilicon layer, a metal layer or any other suitable gate conductor layer) can be formed on the gate dielectric layer. Then, conventional lithographic patterning techniques can be used to pattern the gate(s) such that each gate has a horizontal portion traversing the top surface 216 of either a single semiconductor fin 255a (as shown in FIG. 10A or 11A) or multiple adjacent semiconductor fins 255a-c (as shown in FIG. 10B or 11B) and further such that each gate also has vertical portions adjacent to the opposing sidewalls of the fin(s) and extending from the horizontal portion down to the insulator layer 220.

In the case of the multiple gates 260a-f for the multiple series-connected single-fin or multi-fin MUGFETs 280a-f (as shown in FIGS. 11A-11B), the lithographic patterning techniques can further be performed such that the gates 260a-f all have a same width 261 and each pair of adjacent gates (e.g., gates 260a-b, 260b-c, and so on) will have same pitch 262. Additionally, as mentioned above, during this gate formation process 122, the different locations for the designated channel regions and, thereby the locations for the gates 260a-f along the semiconductor fins 255a-c should be predetermined so that they are offset from (i.e., not aligned with) any interfaces 231 between adjacent epitaxial semiconductor material sections 230a-b, 230b-c and also offset from any bulk semiconductor material sections 210a-c. This can be accomplished if the following conditions are met during lithographic patterning: (1) the semiconductor bodies 210a-c (i.e., the bulk semiconductor material sections of the semiconductor layer 250) are formed such that each semiconductor body 210a-c has a same first width 206 and further such that each pair of adjacent semiconductor bodies (e.g., 210a-b and 210b-c) has a same first pitch 291; and (2) the gates 260a-f are formed such that each gate has a same second width 261, such that each pair of adjacent gates (e.g., 260a-b, 260b-c, and so on) has a same second pitch 262 that is specifically equal to one-half the first pitch 291 (i.e., one-half the pitch of the semiconductor bodies) and such that the distance 263 between any given gate (E.g., 260b) and the closest semiconductor body (e.g., 210a) is specifically equal to one-quarter the first pitch 291 (123).

Following gate formation at process 122, conventional MUGFET processing techniques can be used to complete the single-fin or multi-fin MUGFET device 280 of FIGS. 10A-10B or the multiple series-connected single-fin or multi-fin MUGFET devices 280a-f of FIGS. 11A-11B. This conventional MUGFET processing can include, but is not limited to, source/drain extension region formation, halo region formation, gate sidewall spacer formation, source/drain region formation, silicide formation, interlayer dielectric deposition, contact formation, etc. Techniques for forming such FET components are well-known in the art and, thus, the details are omitted from this specification in order to allow the reader to focus on the salient aspects of the embodiments described.

Figure 12:
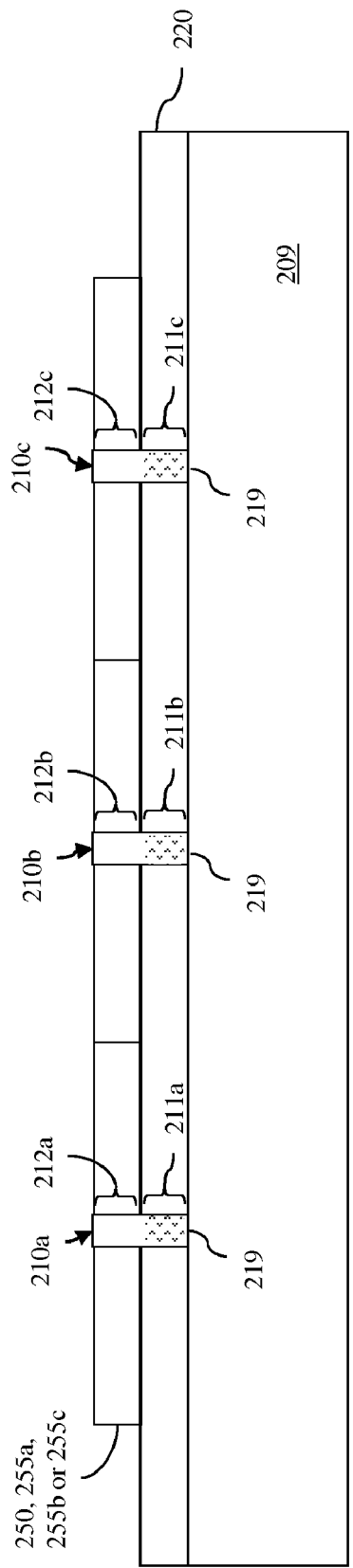
FIG. 12 is a cross-section diagram illustrating additional doping required to ensure adequate isolation of SOI devices formed according to the method of FIG. 1.

It should further be noted that, at some point during the above-described method embodiments, e.g., either immediately before or immediately after the semiconductor bodies 210a-c are formed at process 104, one or more dopant implantation processes should be performed so as to ensure that the lower portions 211a-c of the semiconductor bodies 210a-c are appropriately doped in order to electrically isolate the upper portions 212a-c of those semiconductor bodies 210a-c (and, thereby the semiconductor layer 250 formed at process 110 or any semiconductor fins 255a-c formed at process 120) from the remaining portions 209 of the substrate below the insulator layer 220 (105, see FIG. 12). Those skilled in the art will recognize that the type of dopants 219 implanted into the lower portions 211a-c of the semiconductor bodies 210a-c may vary from region to region across the substrate, depending upon the conductivity type of the devices requiring isolation from the substrate. For example, for n-type devices, the required isolation can be achieved using a p-type conductivity dopant (e.g., a Group III dopant, such as boron (B) or indium (In)), whereas, for p-type devices, the required isolation can be achieved using an n-type conductivity dopant (e.g., a Group V dopant, such as arsenic (As), phosphorous (P) or antimony (Sb)).

Also disclosed herein are embodiments of a semiconductor-on-insulator (SOI) structure, including one or more SOI devices, such as SOI planar FET(s), SOI MUGFET(s) (e.g., a single-fin or multi-fin MUGFET, multiple series-connected single-fin or multi-fin MUGFETs, etc.) or any other SOI device, formed according to the method embodiments described above.

Referring to FIGS. 8A and 8B, an embodiment of a SOI structure 800 can comprise a bulk semiconductor substrate 209 (e.g., a bulk silicon substrate) and an insulator layer 220 (e.g., a silicon dioxide layer) on the substrate 209. Additionally, the SOI structure 800 can comprise a semiconductor layer 250 comprising epitaxial semiconductor material sections 230a-c (i.e., epitaxial layers of semiconductor material, such as silicon) and also bulk semiconductor material sections 210a-c (i.e., semiconductor bodies etched into the top surface of the bulk semiconductor substrate). Specifically, the epitaxial semiconductor material sections 230a-c are on the insulator layer 220, whereas each bulk semiconductor material section is positioned laterally between two discrete epitaxial semiconductor material sections (e.g., bulk semiconductor material section 210a is positioned laterally between epitaxial semiconductor material sections 230a; bulk semiconductor material section 210b is positioned laterally between epitaxial semiconductor material sections 230b, and so on) and further extends vertically through the insulator layer 220 to the substrate 209 below. Furthermore, any pair of adjacent bulk semiconductor material sections (e.g., 210a-b and 210b-c) is separated by joined epitaxial semiconductor material sections (e.g., 230a-b and 230b-c).

The semiconductor structure can further comprise one or more semiconductor-on-insulator (SOI) devices, including but not limited to, SOI planar FET(s), SOI non-planar FET(s) or any other SOI device, formed from the semiconductor layer 250. For example, the SOI structure can further comprise a single-fin MUGFET 280 (as shown in FIG. 10A), a multi-fin MUGFET 280 (as shown in FIG. 10B), multiple series-connected single-fin MUGFETs 280a-f (as shown in FIG. 11A) or multiple series-connected multi-fin MUGFETs 280a-f (as shown in FIG. 11B).

Specifically, the semiconductor layer 250 can be patterned into a single semiconductor fin 255a (as shown in FIG. 9A) or multiple essentially identical parallel semiconductor fins 255a-b (as shown in FIG. 9B) such that, like the semiconductor layer 250, each semiconductor fin comprises: epitaxial semiconductor material sections (i.e., etched portions of the epitaxial layers 230 a-c of semiconductor material) and also bulk semiconductor material sections (i.e., etched portions of the semiconductor bodies 210a-c). The epitaxial semiconductor material sections 230a-c are on the insulator layer 220, whereas each bulk semiconductor material section is positioned laterally between two discrete epitaxial semiconductor material sections (e.g., within each fin 255a-c, bulk semiconductor material section 210a is positioned laterally between epitaxial semiconductor material sections 230a, bulk semiconductor material section 210b is positioned laterally between epitaxial semiconductor material sections 230b, and so on) and extends vertically through the insulator layer 220 to the remaining substrate 209 below. Furthermore, any pair of adjacent bulk semiconductor material sections within a fin is separated by joined epitaxial semiconductor material sections (e.g., adjacent bulk semiconductor material sections 210a and 210b are separated by joined epitaxial semiconductor material sections 230a and 230b and adjacent bulk semiconductor material sections 210b and 210c are separated by joined epitaxial semiconductor material sections 230b and 230c).

For a single-fin or multi-fin MUGFET 280, a gate 260 can be positioned perpendicular to and can traverse the semiconductor fin 255a (as shown in FIG. 10A) or multiple parallel semiconductor fins 255a-b (as shown in FIG. 10B) at a location that is offset from an interface 31 between any joined epitaxial semiconductor material sections (e.g. 230a-230b, 230b-230c) and from any bulk semiconductor material sections 210a-c. In other words, the gate 260 and, thereby FET channel region, is not positioned above (i.e., on, immediately adjacent to, etc.) any interface 231 between any joined epitaxial semiconductor material sections 230a-b, 230b-c or above any bulk semiconductor material sections 210a-c.

For multiple series-connected single-fin or multi-fin MUGFETs 280a-f, multiple gates 260a-f can be positioned perpendicular to and can traverse the semiconductor fin 255a (as shown in FIG. 11A) or the multiple parallel semiconductor fins 255a-c (as shown in FIG. 11B) at different locations such that the gates 260a-f are offset from any of the interfaces 231 between any joined epitaxial semiconductor material sections (e.g. 230a-230b, 230b-230c) and further offset from any bulk semiconductor material sections 210a-c. In other words, the gates 260a-f and, thereby the FET channel regions, are not positioned above (i.e., on, immediately adjacent to, etc.) any interface 231 between any joined epitaxial semiconductor material sections 230a-b, 230b-c or above any bulk semiconductor material sections 210a-c. This can be accomplished if the following conditions are met: (1) each of the bulk semiconductor material sections 210a-c has a same first width 206 and each pair of adjacent bulk semiconductor material sections (e.g., 210a-b, 210b-c) has a same first pitch 291; (2) each of the gates 260a-f has a same second width 261 and each pair of adjacent gates (e.g., 260a-b, 260b-c, 260c-d, and so on) has a same second pitch 262 that is specifically equal to one-half the first pitch 291; and (3) the distance 263 between any given gate (e.g., 260b) on a semiconductor fin and the closest bulk semiconductor material section (e.g., 210a) is specifically equal to one-quarter the first pitch 291.

Additional components (not shown) of the single-fin and multi-fin MUGFET device 280 of FIGS. 10A and 10B and of the multiple series-connected single-fin and multi-fin MUGFET device 280a-f of FIGS. 11A-11B, include but are not limited to, source/drain extension regions, halo regions, gate sidewall spacers, source/drain regions, silicide layers, interlayer dielectrics, contacts, etc. Such FET components are well-known in the art and, thus, the details are omitted from this specification in order to allow the reader to focus on the salient aspects of the embodiments described.

It should be noted that, in the above-described structure embodiments, dopants 219 within the lower portions 211a-c of the bulk semiconductor material sections 210a-c at the same level as the insulator layer 220 ensure that those lower portions 211a-c function as isolation regions, which electrically isolate the upper portions 212a-c of the bulk semiconductor material sections 210a-c and, thereby the semiconductor layer 250 and/or any semiconductor fins 255a-c formed therefrom, from any substrate 209 material below the insulator layer 220 (see FIG. 112). Those skilled in the art will recognize that the type of dopants 219 in the lower portions 211a-c of the bulk semiconductor material sections 210a-c may vary from region to region across the substrate, depending upon the conductivity type of the devices requiring isolation from the substrate. For example, for n-type devices, the required isolation can be achieved using a p-type conductivity dopant (e.g., a Group III dopant, such as boron (B) or indium (In)), whereas, for p-type devices, the required isolation can be achieved using an n-type conductivity dopant (e.g., a Group V dopant, such as arsenic (As), phosphorous (P) or antimony (Sb)).

It should be understood that the term "pitch" as used herein refers to a distance measurement between corresponding locations (e.g., between center points, between same edges, etc.) on adjacent, parallel, essentially identical, features (e.g., gates, semiconductor fins, etc.). It should further be understood that the term "conventional" as used herein with respect to various processes (e.g., a conventional photolithographic process, a conventional anisotropic etch processes, a conventional chemical mechanical planarization (CMP) process, etc.) is meant to indicate that such processes are a well-known in the art and, thus, the details thereof are omitted from this specification in order to allow the reader to focus on the salient aspects of the embodiments described herein. It should further be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention. Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of a method of forming a semiconductor-on-insulator (SOI) structure, including one or more SOI devices, on a bulk semiconductor starting wafer and doing so without requiring additional complex and costly processing steps to ensure adequate isolation for the SOI devices. In the method embodiments, multiple parallel essentially rectangular-shaped semiconductor bodies are formed at the top surface of the wafer. A blanket insulator layer is deposited and recessed to expose upper portions of the semiconductor bodies. Then, the upper portions of the semiconductor bodies are used as seed material for growing epitaxial layers of semiconductor material laterally over the insulator layer, thereby creating a semiconductor layer on the insulator layer. Additional processing can then be performed on the semiconductor layer in order to form one or more SOI devices, including but not limited to, SOI planar FET(s), SOI non-planar FET(s) (e.g., a single-fin or multi-fin MUGFET, multiple series-connected single-fin or multi-fin MUGFETs, etc.) or any other SOI device typically formed on a SOI starting wafer. However, placement of SOI device components in and/or on portions of the semiconductor layer should be predetermined to avoid locations which might impact device performance. For example, placement of any MUGFET gate on a semiconductor fin formed from the semiconductor layer can be predetermined to avoid alignment over interfaces between joined epitaxial semiconductor material sections and/or over bulk semiconductor material sections.

Also disclosed are embodiments of a SOI structure, including one or more SOI devices formed using the above-described method.

Benefits which flow from the above-described method embodiments include, but are not limited to, reduced manufacturing costs for SOI-based technologies. Furthermore, the resulting SOI structure provides improved threshold-voltage tolerance and improved functionality at low power-supply voltages than prior art SOI structures. As a result, lower operating power, higher speed, and lower cost circuits are possible.

What is claimed is:

1. A method of forming a semiconductor structure, said method comprising:
   etching multiple parallel rectangular-shaped semiconductor bodies in a top surface of a bulk semiconductor substrate;
   depositing a blanket insulator layer over said semiconductor bodies;
   recessing said blanket insulator layer to expose upper portions of said semiconductor bodies;
   growing epitaxial layers of semiconductor material laterally from opposing sidewalls of said upper portions of said semiconductor bodies until any epitaxial layers grown in opposite directions from adjacent semiconductor bodies join to create a single semiconductor layer; and
   forming, from said semiconductor layer, at least one semiconductor fin above said insulator layer and perpendicular to said semiconductor bodies such that said at least one semiconductor fin comprises at least one pair of joined epitaxial semiconductor material sections.

2. The method of claim 1, said forming of said at least one semiconductor fin above said insulator layer and perpendicular to said semiconductor bodies further being performed such that said at least one semiconductor fin further comprises:
   multiple epitaxial semiconductor material sections on said insulator layer; and
   multiple bulk semiconductor material sections, each of said bulk semiconductor material sections being positioned laterally between two discrete epitaxial semiconductor material sections and extending vertically through said insulator layer to said substrate and each pair of adjacent bulk semiconductor material sections separated by two joined epitaxial semiconductor material sections.

3. The method of claim 2, further comprising: forming, for a non-planar field effect transistor, a gate perpendicular to and traversing said at least one semiconductor fin at a location that is offset from an interface between any joined epitaxial semiconductor material sections.

4. The method of claim 2, further comprising: forming, for multiple series-connected non-planar field effect transistors, multiple gates perpendicular to and traversing said at least one semiconductor fin at different locations.

5. The method of claim 4, said multiple gates being formed such that said multiple gates are all offset from any interfaces between any joined epitaxial semiconductor material sections.

6. The method of claim 4,
   said semiconductor bodies being formed such that each pair of adjacent semiconductor bodies have a same first pitch, and
   said multiple gates being formed such that each pair of adjacent gates has a same second pitch that is equal to one-half said first pitch and such that a distance between any given gate and a closest semiconductor body is equal to one-quarter said first pitch in order to ensure that said multiple gates are all offset from any interfaces between any joined epitaxial semiconductor material sections.

7. The method of claim 1, further comprising: performing a dopant implantation process to ensure that lower portions of said semiconductor bodies are appropriately doped in order to electrically isolate said upper portions of said semiconductor bodies from any substrate material below said insulator layer.

8. The method of claim 1, said bulk semiconductor substrate comprising a bulk silicon substrate and said semiconductor material comprising silicon.

9. The method of claim 1, said recessing of said blanket layer being performed such a height of said upper portions of said semiconductor bodies exposed is approximately equal to a desired thickness of said semiconductor layer.

10. The method of claim 1, said growing of said epitaxial layers being performed with a mask layer on a top surface of each of said semiconductor bodies to prevent said semiconductor material from growing vertically and said method further comprising, after said growing of said epitaxial layers, removing said mask layer.

11. A method of forming a semiconductor structure, said method comprising:
    etching multiple parallel rectangular-shaped semiconductor bodies in a top surface of a bulk semiconductor substrate;
    depositing a blanket insulator layer over said semiconductor bodies;
    recessing said blanket insulator layer to expose upper portions of said semiconductor bodies;
    growing epitaxial layers of semiconductor material laterally from opposing sidewalls of said upper portions of said semiconductor bodies until any epitaxial layers grown in opposite directions from adjacent semiconductor bodies join to create a single semiconductor layer;
    forming, from said semiconductor layer, multiple parallel semiconductor fins above said insulator layer and perpendicular to said semiconductor bodies such that each of said semiconductor fins comprises:
       epitaxial semiconductor material sections on said insulator layer; and
       bulk semiconductor material sections, each of said bulk semiconductor material sections being positioned laterally between two discrete epitaxial semiconductor material sections and extending vertically through said insulator layer to said substrate and each pair of adjacent bulk semiconductor material sections being separated by two joined epitaxial semiconductor material sections; and
    forming, for multiple series-connected non-planar field effect transistors, multiple gates perpendicular to and traversing said multiple parallel semiconductor fins at different locations,
    said semiconductor bodies being formed such that each pair of adjacent semiconductor bodies have a same first pitch and
    said multiple gates being formed such that each pair of adjacent gates has a same second pitch that is equal to one-half said first pitch and such that a distance between any given gate and a closest semiconductor body is equal to one-quarter said first pitch in order to ensure that said gates are all offset from any interfaces between any joined epitaxial semiconductor material sections.

12. The method of claim 11, further comprising: performing a dopant implantation process to ensure that lower portions of said semiconductor bodies are appropriately doped in order to electrically isolate said upper portions of said semiconductor bodies from any substrate material below said insulator layer.

13. The method of claim 11, said bulk semiconductor substrate comprising a bulk silicon substrate and said semiconductor material comprising silicon.

14. The method of claim 11, said recessing of said blanket insulator layer being performed such that a height of said upper portions of said semiconductor bodies exposed is approximately equal to a desired thickness of said semiconductor layer.

15. The method of claim 11, said growing of said epitaxial layers being performed with a mask layer on a top surface of each of said semiconductor bodies to prevent said semiconductor material from growing vertically and said method further comprising, after said growing of said epitaxial layers, removing said mask layer.

16. A method of forming a semiconductor structure, said method comprising:
    etching multiple parallel rectangular-shaped semiconductor bodies in a top surface of a bulk semiconductor substrate;
    depositing a blanket insulator layer over said semiconductor bodies;
    recessing said blanket insulator layer to expose upper portions of said semiconductor bodies;
    growing epitaxial layers of semiconductor material laterally from opposing sidewalls of said upper portions of said semiconductor bodies until any epitaxial layers grown in opposite directions from adjacent semiconductor bodies join to create a single semiconductor layer;
    forming, from said semiconductor layer, at least one semiconductor fin above said insulator layer and perpendicular to said semiconductor bodies; and
    performing a dopant implantation process to ensure that lower portions of said semiconductor bodies are appropriately doped in order to electrically isolate said upper portions of said semiconductor bodies from any substrate material below said insulator layer.

17. The method of claim 16, said forming of said at least one semiconductor fin above said insulator layer and perpendicular to said semiconductor bodies ensures that said at least one semiconductor fin comprises:
    epitaxial semiconductor material sections on said insulator layer; and
    bulk semiconductor material sections, each of said bulk semiconductor material sections being positioned laterally between two discrete epitaxial semiconductor material sections and extending vertically through said insulator layer to said substrate and any pair of adjacent bulk semiconductor material sections being separated by two joined epitaxial semiconductor material sections.

18. The method of claim 17, further comprising: forming, for a non-planar field effect transistor, a gate perpendicular to and traversing said at least one semiconductor fin at a location that is offset from an interface between any joined epitaxial semiconductor material sections.

19. The method of claim 17, further comprising: forming, for multiple series-connected non-planar field effect transistors, multiple gates perpendicular to and traversing said at least one semiconductor fin at different locations.

20. The method of claim 19, said multiple gates being formed such that said multiple gates are all offset from any interfaces between any joined epitaxial semiconductor material sections.

21. The method of claim 19,
    said semiconductor bodies are formed such that each pair of adjacent semiconductor bodies have a same first pitch, and
    said multiple gates being formed such that each pair of adjacent gates has a same second pitch that is equal to one-half said first pitch and such that a distance between any given gate and a closest semiconductor body is equal to one-quarter said first pitch in order to ensure that said multiple gates are all offset from any interfaces between any joined epitaxial semiconductor material sections.

22. The method of claim 16, said bulk semiconductor substrate comprising a bulk silicon substrate and said semiconductor material comprising silicon.

23. The method of claim 16, said recessing of said blanket layer being performed such a height of said upper portions of said semiconductor bodies exposed is approximately equal to a desired thickness of said semiconductor layer.

24. A method of forming a semiconductor structure, said method comprising:
    etching multiple parallel rectangular-shaped semiconductor bodies in a top surface of a bulk semiconductor substrate;
    depositing a blanket insulator layer over said semiconductor bodies;
    recessing said blanket insulator layer to expose upper portions of said semiconductor bodies;
    growing epitaxial layers of semiconductor material laterally from opposing sidewalls of said upper portions of said semiconductor bodies until any epitaxial layers grown in opposite directions from adjacent semiconductor bodies join, thereby creating a single semiconductor layer;
    forming, from said semiconductor layer, at least one semiconductor fin above said insulator layer and perpendicular to said semiconductor bodies such that said at least one semiconductor fin comprises at least one pair of joined epitaxial semiconductor material sections; and
    forming, for a non-planar field effect transistor, a gate perpendicular to and traversing said at least one semiconductor fin at a location that is offset from an interface between said pair of joined epitaxial semiconductor material sections.

* * * * *